(12) United States Patent  
Sardat

(10) Patent No.: US 7,737,650 B2  
(45) Date of Patent: Jun. 15, 2010

(54) MOS TRANSISTOR CONTROL

(75) Inventor: Pierre Sardat, Le Raincy (FR)

(73) Assignee: Valeo Equipements Electriques Moteur, Creteil (FR)

( * ) Notice: Subject to any disclaimer, the term of this patent is extended or adjusted under 35 U.S.C. 154(b) by 320 days.

(21) Appl. No.: 11/909,112

(22) PCT Filed: Mar. 22, 2006

(86) PCT No.: PCT/FR2006/000621

§ 371 (c)(1),  
(2), (4) Date: Sep. 19, 2007

(87) PCT Pub. No.: WO2006/103333

PCT Pub. Date: Oct. 5, 2006

(65) Prior Publication Data

US 2009/0230906 A1     Sep. 17, 2009

(30) Foreign Application Priority Data

Mar. 31, 2005     (FR) .................................. 05 03157

(51) Int. Cl.  
*H02P 6/14*     (2006.01)

(52) U.S. Cl. ............................ 318/400.26; 318/400.01; 318/700; 363/89; 363/125; 363/127; 327/494; 327/404; 327/375; 327/381; 327/52; 327/376; 327/56; 361/78; 361/79

(58) Field of Classification Search ................. 327/375, 327/376, 377, 381, 52, 56, 494, 404; 363/135, 363/136, 137, 138, 89, 127, 125; 361/78, 361/79; 318/400.26, 400.01  
See application file for complete search history.

(56) References Cited

U.S. PATENT DOCUMENTS

| 3,978,393 | A | * | 8/1976 | Wisner et al. ................ 323/272 |
| 4,213,068 | A | * | 7/1980 | Ahmed ........................ 327/375 |
| 4,749,876 | A | * | 6/1988 | Gale et al. ................... 327/109 |
| 4,837,495 | A | * | 6/1989 | Zansky ........................ 323/222 |
| 5,444,309 | A | * | 8/1995 | Innes et al. .................. 307/125 |

(Continued)

FOREIGN PATENT DOCUMENTS

WO     2004034439 A2     4/2004

*Primary Examiner*—Rita Leykin  
(74) *Attorney, Agent, or Firm*—Jacox, Meckstroth & Jenkins

(57) ABSTRACT

The invention concerns a method for controlling a switching assembly comprising a plurality of transistors connected in parallel, having a linear operating mode, a closed-switch operating mode and an off operating mode including a first operating phase during which a current flows from a source terminal to a drain terminal and a second operating phase during which no current flows. The method includes the following successive steps; (a) controlling the switching assembly in closed-switch mode during part of the first phase; (b) controlling the switching assembly in linear mode; (c) controlling the assembly in off mode during part of the second phase.

16 Claims, 2 Drawing Sheets

U.S. PATENT DOCUMENTS

| | | | |
|---|---|---|---|
| 6,108,376 A * | 8/2000 | Morgan et al. | 375/239 |
| 6,212,082 B1 * | 4/2001 | Bailly | 363/89 |
| 6,212,084 B1 | 4/2001 | Turner | |
| 6,229,370 B1 * | 5/2001 | Inamori et al. | 327/308 |
| 6,324,042 B1 * | 11/2001 | Andrews | 361/93.2 |
| 6,364,877 B1 * | 4/2002 | Goble et al. | 606/34 |
| 6,430,071 B1 | 8/2002 | Haneda | |
| 6,614,288 B1 * | 9/2003 | Dagan et al. | 327/365 |
| 6,697,245 B2 * | 2/2004 | Andrews | 361/93.2 |
| 6,940,189 B2 * | 9/2005 | Gizara | 307/151 |
| 7,183,834 B2 | 2/2007 | Nadd et al. | |
| 7,218,164 B2 * | 5/2007 | Vitale et al. | 327/376 |
| 2004/0125627 A1 | 7/2004 | Nadd et al. | |
| 2007/0069289 A1 | 3/2007 | Nadd et al. | |

* cited by examiner

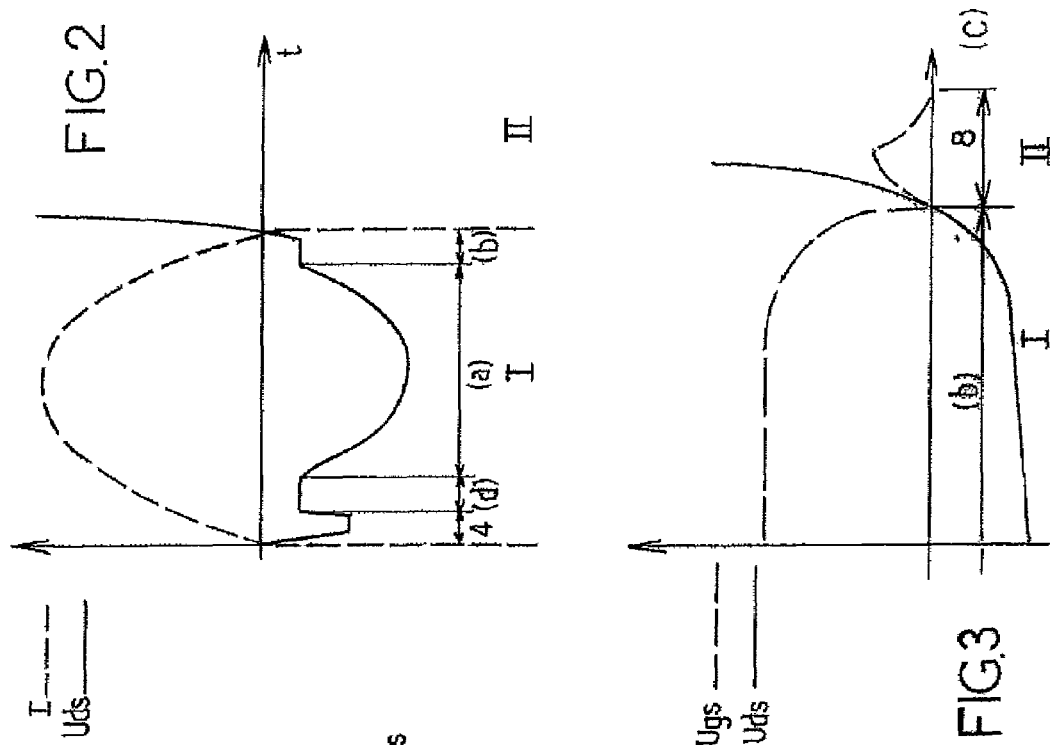
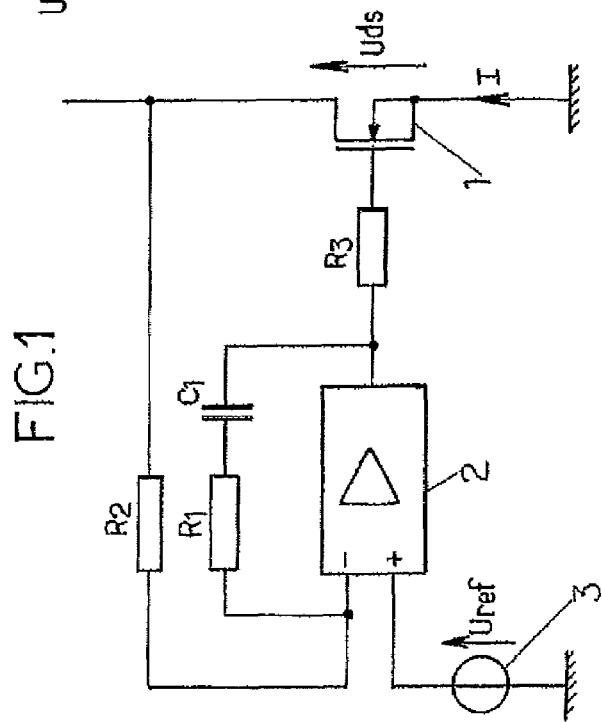

MOS TRANSISTOR CONTROL

BACKGROUND OF THE INVENTION

1. Field of the Invention

The present invention concerns the control of transistors and more particularly MOS transistors (MOSFETs).

2. Description of the Related Art

In certain applications, an MOS transistor is included in an electrical conversion bridge, such as a voltage rectifying bridge. Such an electrical conversion bridge, for example an inverter, can be used reversibly. Thus it is known how to make function as an alternator an electric motor controlled by a reversible inverter comprising MOSFETs, using an internal diode of the MOSFETs as a rectifying element. This amounts to using the inverter as a diode bridge. However, the voltage drop at the terminals of the internal diodes gives rise to significant electrical losses.

This is why each MOS transistor is switched into the on state when a reverse current (negative current) flows between its drain and its source (phase I), and into the off state the rest of the time (phase II).

In addition, in order to increase the intensity of the current allowable in each switching unit, it is known from the U.S. Pat. No. 6,430,071 how to employ switching assemblies comprising a plurality of transistors connected in parallel. These switching assemblies used in electrical conversion bridges are controlled alternately in off saturated mode and in on saturated mode. Nevertheless, because of the voltage drop at the terminals of the internal diodes, significant switching losses are observed.

It is also known, from the document WO-A-2004/034439 how to control the MOSFETs in linear mode in the on state, this is to say to control their internal resistance linearly in order to keep constant the voltage at the drain/source terminals of the transistor. This is achieved by means of a control.

However, in the case of currents of high amplitude, the control imposes an instruction on the transistor such that the latter can go into closed-switch mode, the internal resistance of the transistor then reaching its minimum value (ON state). When the transistor must be then switched into the non-conducting state (OFF state), the command must make it pass from the ON state to the OFF state. For this purpose, it is necessary to discharge the electrical charges accumulated in the transistor. Consequently there is in general observed a delay in the switching that gives rise to the appearance of a high overlap current. This may reduce the performance of the conversion bridge, in particular the radio interference, losses by Joule effect and stray ripples on the on board system.

SUMMARY OF THE INVENTION

The aim of the present invention is in particular to mitigate these drawbacks.

A first aspect of the invention proposes a method of controlling a switching assembly comprising a plurality of transistors connected in parallel, having:

a linear operating mode in which the internal resistance of the transistors can be controlled within a given range of values;

a closed-switch operating mode, in which the internal resistance is equal to a minimum value; and an off operating mode, in which the internal resistance is equal to a maximum value.

The method comprises:

a first operating phase during which a current flows from a source terminal to a drain terminal of the transistors;

a second operating phase during which no current flows.

In addition, the method comprises the steps according to which, successively:

(a) the transistors in the switching assembly are controlled in a common fashion in closed-switch mode for at least part of the first phase;

(b) the transistors are controlled in a common fashion in linear mode at the end of the first phase for at least a first given period;

(c) the transistors are controlled in a common fashion in off mode for at least part of the second phase.

By virtue of these provisions, the switching is achieved more easily, since the electrical conversion bridge is faster. This is because, by returning to linear mode before switching to the off state, the quantity of charges accumulated in each transistor is much lower, and therefore faster to discharge. In this way rapid switching, therefore improving the performance of the electrical conversion bridge, is ensured.

In various embodiments of the method according to the invention, it is if necessary possible to have recourse in addition to one or other or both of the following provisions:

a step (d), prior to step (a), during which each transistor is controlled in linear mode for at least part of the first phase;

when the method is implemented in an electrical conversion bridge functioning periodically, the first period is greater than or equal to 5% of the first phase;

a drain/source voltage Uds increases during the second phase and reaches a slope of maximum rise, and each transistor in the switching assembly has a small stray capacitance discharge time so that a gate/source voltage Ugs is substantially less than a given threshold value when the drain/source voltage Uds reaches the said slope of maximum rise;

the method is implemented in an electrical conversion bridge;

the electrical conversion bridge is connected to a rotary electrical machine able to function alternately as an alternator or as a motor;

the method is used to control the switch.

In addition, a second aspect of the invention proposes a transistor control device comprising means for implementing the method according to the first aspect.

Such a device advantageously comprises a comparator and adjustment means comprising:

a capacitor and a resistor in series connected between an output of the comparator and an input of the comparator, a resistor connected between the said output of the comparator and the gate terminal of the switching assembly, and a resistor connected between the said input of the comparator and the drain terminal of the switching assembly.

Other objects and advantages of the invention will be apparent from the following description, the accompanying drawings and the appended claims.

BRIEF DESCRIPTION OF THE DRAWINGS

Other characteristics and advantages of the invention emerge from a reading of the following description of one of its embodiments, given by way of non-limitative example, with regard to the accompanying drawings.

FIG. 1 is a diagram of a device according to a second aspect of the invention;

FIG. 2 is a timing diagram showing the change over time in the source/drain voltage and the current in a switching assembly comprising MOS transistors when the method according to a first aspect of the invention is implemented;

FIG. 3 is a timing diagram showing in more detail the change as a function of time in the source/drain voltage and the gate/source voltage of the switching assembly.

In the various figures, the same references designate identical or similar elements.

DESCRIPTION OF THE PREFERRED EMBODIMENTS

Figure 4:
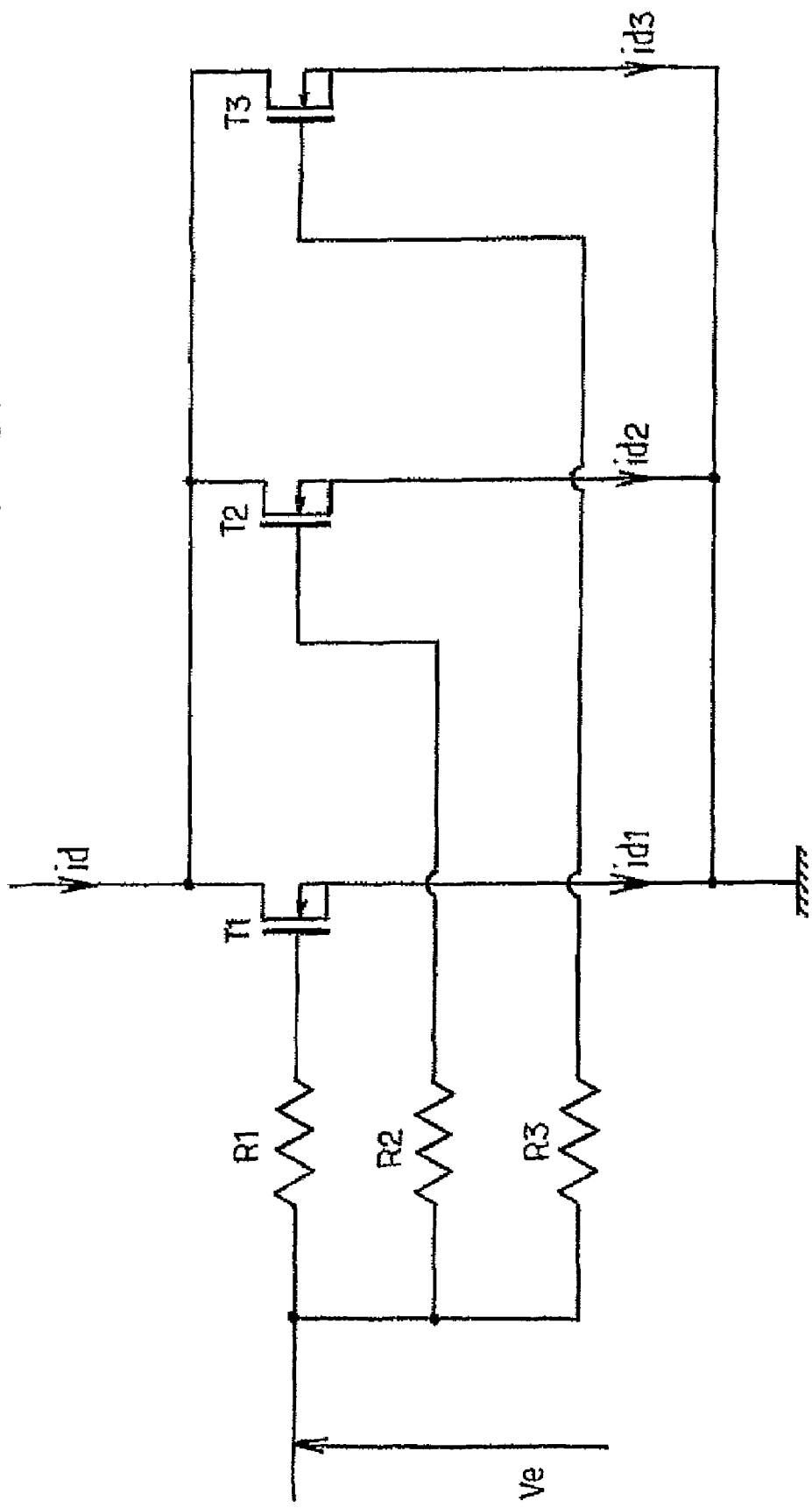
FIG. 4 shows the switching assembly in an example embodiment of the invention.

As shown in FIG. 1, a control circuit of a switching assembly 1, comprising transistors connected in parallel MOS, can for example comprise an error amplifier 2, which can be implemented with an operational amplifier 2. The voltage at the drain/source terminals of the switching assembly (denoted Uds hereinafter and in the figures) can be compared with a reference voltage 3 (denoted Uref hereinafter and in the figures), for example negative. The error amplifier 2 controls the switching assembly 1 for example by simultaneously applying a voltage to the gate of each transistor in the switching assembly 1. In addition, this control circuit comprises a return loop, comprising preferentially a capacitor C1 and two resistors R1 and R2.

In operation, when the drain/source voltage becomes negative, the switching assembly 1 is controlled by applying a positive voltage to its gate. It is thus possible to make the internal resistance of the transistors vary so that the drain/source voltage drop due to the passage of the current I passing through the transistors from the source to the drain does not exceed the reference voltage. It is thus possible to keep the voltage at the terminals of the switching assembly 1 constant.

However, in the case of currents of high amplitude (for example 150 A), the product of the intensity of the current passing through each transistor and the minimum internal resistance of the transistors is greater than the reference voltage value. Thus the voltage applied to the gate by the error amplifier 2 is so high that the transistors go into closed-switch mode (ON state). The change in the voltages and currents at the switching assembly 1 is described by the timing diagram in FIG. 2 in such a case.

In the case of the implementation of this method in an electrical conversion bridge, two phases can be distinguished. The first phase (denoted I hereinafter and in the figures) corresponds to a negative drain/source voltage, and in which a current passes in the switching assembly 1. Conversely, the second phase (denoted II hereinafter and in the figures) corresponds to a positive drain/source voltage in which the switching assembly 1 is deemed to be completely off (no current is passing). Thus, when the voltage at the terminals of the switching assembly 1 becomes negative, the latter enters phase I. The period denoted 4 in FIG. 2 on the curve showing the change in the voltage at the drain/source terminals of the switching assembly 1 corresponds to the time necessary for the control to begin to control the transistors. Then the control attempts to maintain the voltage Uds constant by modifying the internal resistance of the transistors. Each transistor can therefore function in a linear fashion in the period denoted (d). However, the current I, shown in dotted lines, reaches such a high value that the internal resistance reaches its minimum value Rdson and the switching assembly 1 goes into closed-switch mode (ON state). This corresponds to the period denoted (a) in FIG. 2 on the curve. The internal resistance of each transistor 1 becoming substantially constant, the voltage at its terminals becomes proportional to the current passing through this transistor.

Next, in order to ensure correct switching when passing from phase I to phase II, during which the transistors are off, each transistor is controlled in a linear fashion, during the period denoted (b). To do this, it is necessary to ensure that the control, illustrated by the diagram in FIG. 1, is sufficiently rapid to return the switching assembly 1 to linear mode as soon as the current I passes below a given value (Vref/Rdson). To this end, the switching assembly 1 can comprise adjustment means.

In one example embodiment, these adjustment means can comprise a capacitance and resistances, in particular formed by the capacitor C1 and the resistors R1, R2, R3. The capacitor C1 is connected between the output of the operational amplifier 2 and a connection of the resistor R1. The other connection of the resistor R1 is connected to the input (−) of the operational amplifier 2. The resistor R2 is connected between the drain of the switching assembly 1 and the inverting input of the operational amplifier 2. The resistor R3 is connected between the output of the operational amplifier 2 and the gate of the switching assembly 1. The values of the resistance and capacitance are such that the control performance is improved, in particular when the intensity of the instantaneous current is below a given value. Thus the speed of the control is such that this can control the transistors in rapid linear mode up to the end of phase I, before passing to phase II.

Consequently the voltage Uds becomes constant again during the period denoted (b), so that the switching of the transistors occurring between phase I and phase II is more rapid.

In one embodiment, it is ensured that the period (b) represents more than 5%, preferably more than 10%, of the duration of phase I. This percentage depends on the current levels circulating in the conversion bridge. In the case of a bridge rectifier, in particular, the bridge functions periodically, and phase I is substantially equal to an operating half-period. The electrical charges accumulated in the transistor I thus have the time to be discharged before passing to phase II.

Then the voltage Uds becomes positive, then causing passage into phase II. During this phase II, the transistors in the switching assembly 1 are off and the current passing through them is substantially zero. This is illustrated by the part (c) of the curve in FIG. 3. As the functioning of an electrical conversion bridge is periodic, phase I is passed to again at the end of phase II.

Preferably, it is also ensured that the switching off of the transistors, which takes place between the end of phase I and the start of phase II, is fairly rapid so as not to be interfered with by the Miller effect. This is because a stray capacitance on the transistors accumulates charges because of the rapid variation in the drain/source voltage at the terminals of the transistors and causes an increase in the voltage between the gate and the source.

This increase, represented by part 8 of the curve in FIG. 3, may cause a switching of the switching assembly 1 corresponding to an unwanted return to a transient conductive state. This is because, if the gate source voltage Ugs is still fairly high when the additional increase in voltage due to the Miller effect is added, the voltage Ugs may exceed the threshold voltage of the transistors of the switching assembly 1 (generally denoted $V_{TH}$). Consequently the switching assembly 1 can once again switch into the on state.

To prevent this, it is necessary for the control unit of the switching assembly 1 to discharge the stray capacitances of the transistor sufficiently before the voltage Uds reaches its slope of maximum rise. This discharge time is a function of the resistance R3 and the total charge stored by the transistors in their stray capacitances. So that the control unit controls the switching assembly 1 as rapidly as possible, it is possible for example to choose an operational amplifier 2 having a high "slew rate" and high output current capacitances, that is to say the possibility of making the output voltage of the error comparator vary very rapidly. The latter then ceasing to behave as a linear amplifier, in order to transform itself advantageously into a fast comparator.

Advantageously, as shown in FIG. 4, a switching assembly 1 is used comprising a plurality of transistors T1, T2 and T3, connected to one another in parallel. It is thus possible to increase the power of the electrical conversion bridge, which in fact allows higher currents.

As is generally accepted, the use of a plurality of transistors connected in parallel is in principle reserved for devices functioning in open/closed switch mode. This is because, because of the disparities existing from one component to another, the use of a plurality of transistors connected in parallel and functioning in linear mode results in an unequal distribution of the currents flowing respectively though each transistor. The consequence is difficulties in ensuring the control in linear mode of the transistors and the distribution of the currents, requiring the designers generally to insert resistive elements at the source or emitter of each transistor in order to distribute the current consumption, or to provide a linear mode control device for each transistor.

Obviously, the first solution would cause significant losses incompatible with an alternator-starter control device, in which functioning in starter mode requires currents exceeding 700 amperes and high available torque for starting the thermal engines. The starter function could not be provided with such a device. The second solution can also not be envisaged since this would cause a high increase in the cost and size of the device.

However, with regard to the device according to the invention, the equal distribution of currents is not essential because of the control of the transistors connected in parallel, which adjusts the voltage Vgs of all the transistors to a single value, forcing the voltage Vds to a regulated value common to all the transistors.

In addition, the number of transistors in a switching assembly 1 does not affect the performance of the regulation, and in particular the dynamic behavior of the switching assembly 1. Thus the transfer function, representing the frequency behavior of the switching assembly 1, is, against all expectations, little affected by putting a plurality of transistors of an identical type in parallel even when the currents are badly distributed.

This is because, in a small-signal study, it can be considered that the product gi.Rdsi (where gi designates the transconductance of a MOSFET and Rdsi is the internal resistance between the drain and source) for each transistor Ti is constant and approximately identical from one transistor to another if these transistors are of identical technologies and of the same chip size. Under these circumstances, the stray capacitances of each transistor are substantially identical in the case of small signals.

The current id entering the gate terminal common to all the transistors can therefore be evaluated as follows for three transistors T1, T2 and T3, as illustrated in FIG. 4:

$$id=id1+id2+id3=g1.vgs1-g2.vgs2-g3.vgs3$$

that is to say $id=g1.[ve/(1+\sigma1.p)]-g2.[ve/(1+\sigma2.p)]-g3.[ve/(1+\sigma3.p)]$ where σi is equal to the product Ri.Ci, ve is the voltage at the common control terminal and p is the Laplace variable. If the transistors are of identical types, then $C1 \approx C2 \approx C3$. Moreover, at the time of design, the input resistors, R1, R2 and R3 are chosen identical.

Consequently, $\sigma \approx \sigma1 \approx \sigma2 \approx \sigma3$ can be posed.

It is then found that the transfer function of the switching assembly 1 is of the form:

$$\frac{vds}{ve} = \frac{-g \cdot Rds}{(1+\sigma \cdot p)}$$

Consequently, the general behavior of the switching assembly 1 is little modified vis-á-vis the case of a switching assembly 1 with a single transistor.

This method and device can be implemented in any system needing a rectifying system such as a bridge rectifier, a simple switch, for example a switch for a battery, or an inverter, for example a reversible inverter connected to a rotary electrical machine.

While the method herein described, and the form of apparatus for carrying this method into effect, constitute preferred embodiments of this invention, it is to be understood that the invention is not limited to this precise method and form of apparatus, and that changes may be made in either without departing from the scope of the invention, which is defined in the appended claims.

What is claimed is:

1. A method of controlling a switching assembly comprising:
   a plurality of transistors connected in parallel;
   a linear operating mode in which an internal resistance of said plurality of transistors can be controlled in a given range of values;
   a closed-switch operating mode, in which said internal resistance is equal to a minimum value; and
   an off operating mode, in which said internal resistance is equal to a maximum value; wherein said method further comprises:
   a first operating phase during which a current flows from a source terminal to a drain terminal of said plurality of transistors;
   a second operating phase in which no current flows;
   wherein said method which comprises said steps according to which, successively:
   (a) wherein said plurality of transistors of the switching assembly are controlled in a common fashion in closed-switch mode during at least part of said first phase;
   (b) wherein said plurality of transistors are controlled in a common fashion in linear mode at the end of said first phase during at least a first given period; and
   (c) wherein said plurality of transistors are controlled in a common fashion in off mode during at least part of said second phase.

2. The method according to claim 1, also comprising a step, prior to step, during which said switching assembly is controlled in linear mode during at least part of said first phase.

3. The method according to claim 1, implemented in an electrical conversion bridge functioning periodically, according to which said first period is greater than or equal to 5% of said first phase.

4. The method according to claim 1, according to which a drain/source voltage Uds increases during said second phase, and reaches a slope of maximum rise, and according to which said plurality of transistors in the switching assembly have a short stray capacitance discharge time so that a gate/source voltage Ugs is substantially less than a given threshold value when the drain/source voltage Uds reaches the said slope of maximum rise.

5. The method according to claim 1, according to which implemented in an electrical conversion bridge.

6. The method according to claim 5, according to which the electrical conversion bridge is connected to a rotary electrical machine able to function alternately as an alternator or as a motor.

7. The method according to claim 1, implemented in order to control a switch.

8. A device for controlling a switching assembly comprising a plurality of transistors connected in parallel, comprising means for controlling a switching assembly comprising:

a plurality of transistors connected in parallel;
a linear operating mode in which an internal resistance of said plurality of transistors can be controlled in a given range of values;
a closed-switch operating mode, in which said internal resistance is equal to a minimum value; and
an off operating mode, in which said internal resistance is equal to a maximum value; wherein said method further comprises:
a first operating phase during which a current flows from a source terminal to a drain terminal of said plurality of transistors;
a second operating phase in which no current flows;
wherein said method which comprises said steps according to which, successively;
  (a) wherein said plurality of transistors of the switching assembly are controlled in a common fashion in closed-switch mode during at least part of said first phase;
  (b) wherein said plurality of transistors are controlled in a common fashion in linear mode at the end of said first phase during at least a first given period; and
  (c) wherein said plurality of transistors are controlled in a common fashion in off mode during at least part of said second phase.

9. The device according to claim 8, also comprising a comparator and adjustment means comprising:
  a capacitor and a resistor connected in series between an output of said comparator and an input of said comparator, a resistor connected between the said output of the comparator and the gate terminal of the switching assembly, and a resistor connected between the said input of said comparator and the drain terminal of said switching assembly.

10. A method of controlling a switching assembly comprising a plurality of transistors adapted to comprise the following operating modes:
  a linear operating mode in which an internal resistance of said plurality of transistors can be controlled in a given range of values;
  an off operating mode in which said internal resistance is equal to a maximum value; said method comprising the steps of:
  causing a first operating phase during which a current flows from a source terminal to a drain terminal of said plurality of transistors;
  causing a second operating phase in which no current flows;
  controlling said plurality of transistors in a closed-switch operating mode during at least part of said first operating phase;
  wherever said internal resistance is equal to a minimum value during said closed switch operating mode;
  controlling said plurality of transistors in said linear operating mode at the end of said first operating phase during at least a first given period; and
  controlling said plurality of transistors in said off operating mode during at least part of said second operating phase.

11. The method according to claim 10, also comprising a step during which the switching assembly is controlled in said linear operating mode during at least part of the first operating phase.

12. The method according to claim 10, implemented in an electrical conversion bridge functioning periodically, according to which the said first period is greater than or equal to 5% of the first operating phase.

13. The method according to claim 10, according to which a drain/source voltage Uds of said plurality of transistors increases during the second operating phase, and reaches a slope of maximum rise, and according to which said plurality of transistors in the switching assembly have a short stray capacitance discharge time so that a gate/source voltage Ugs is substantially less than a given threshold value when the drain/source voltage Uds reaches the said slope of maximum rise.

14. The method according to claim 10, according to which said method is implemented in an electrical conversion bridge.

15. The method according to claim 14, according to which the electrical conversion bridge is connected to a rotary electrical machine able to function alternately as an alternator or as a motor.

16. A method according to claim 10, wherein said switching assembly, further comprises a comparator and adjustment means comprising;
  a capacitor and a resistor connected in series between an output of the comparator and an input of the comparator, a resistor connected between the said output of the comparator and the gate terminal of the switching assembly, and a resistor connected between the said input of the comparator and said drain terminal of the switching assembly.

* * * * *